United States Patent [19]

Hüser

[11] Patent Number: 5,202,589
[45] Date of Patent: Apr. 13, 1993

[54] APPARATUS FOR DETECTING THE CONDITION OF SWITCHES IN ONE TRANSMISSION LINE

[75] Inventor: Klaus Hüser, Stuttgart, Fed. Rep. of Germany

[73] Assignee: Robert Bosch GmbH, Stuttgart, Fed. Rep. of Germany

[21] Appl. No.: 549,009
[22] PCT Filed: Jun. 16, 1988
[86] PCT No.: PCT/EP88/00533
§ 371 Date: Sep. 13, 1990
§ 102(e) Date: Sep. 13, 1990
[87] PCT Pub. No.: WO89/12928
PCT Pub. Date: Dec. 28, 1989
[51] Int. Cl.$^5$ .................... H03K 5/153; H03K 5/159
[52] U.S. Cl. .................... 307/350; 307/242; 307/355; 340/644
[58] Field of Search .............. 307/242, 350, 352, 355, 307/290; 340/644

[56] References Cited

U.S. PATENT DOCUMENTS

| | | | |
|---|---|---|---|
| 3,716,850 | 2/1973 | Fisher et al. | 340/365 E |
| 3,765,015 | 10/1973 | Gruner | 340/365 E |
| 3,889,200 | 6/1975 | Tyau | 307/290 |
| 3,919,073 | 6/1975 | Mooney | 307/88.5 |
| 4,425,563 | 1/1984 | Nakayama et al. | 340/644 |
| 4,982,115 | 6/1991 | Lee | 307/355 |

FOREIGN PATENT DOCUMENTS 2084417 4/1982 United Kingdom.

Primary Examiner—Timothy P. Callahan
Attorney, Agent, or Firm—Frishauf, Holtz, Goodman & Woodward

[57] ABSTRACT

The switch condition of two switches (S1, S2) connected in parallel to a single transmission line (11) is detected by the signals output from two Schmitt triggers (10a, 10b) which are arranged to operate at different switching threshold levels by virtue of the output (WA) of one of the triggers (10a) being connected to the threshold level control input (F) of the other trigger (10b). Closure of one of the switches (S1 or S2) causes a reference voltage (UR) to the applied to the inputs of the triggers (10a, 10b) which is turn causes the upper threshold trigger (10a) to operate. Closure of both switches (S1 and S2) reduces the level of the voltage applied to the inputs of the triggers which is turn causes the lower threshold trigger to operate. Preferably, the signal input to the lower threshold trigger is converted into a current prior to application to the trigger due to the relatively small difference in threshold levels.

17 Claims, 2 Drawing Sheets

APPARATUS FOR DETECTING THE CONDITION OF SWITCHES IN ONE TRANSMISSION LINE

BACKGROUND

The present invention relates to apparatus for detecting the condition of two switches connected to a single transmission line.

Many systems are electronically controlled using microprocessors which are supplied with signals from external sensors. In many systems, the sensors comprise switch devices of one sort or another and it is important to be able to recognise the condition of each switch device. Ideally, each switch device would be connected to the microprocessor by a respective transmission line or else a bus would interconnect all switch devices and each switch device would have a unique address. The first of the ideal solutions is not possible in some circumstances due to lack of space and the second is expensive and requires a special construction of control system. There thus occurs in practice a situation where more than one switch device is connected to a processor by a single transmission line.

It is possible to evaluate the conditions of two switch devices on a single transmission using digital evaluation techniques in a digital channel, but often all digital channels in a microprocessor are fully utilised.

The present invention provides an arrangement whereby an analog channel can be used to evaluate the condition of each of two switches on a single analog transmission line.

The advantages of this arrangement are that no analog channel into the processor is required and hence no A/D conversion. Processor inputs designed for other tasks can be utilised with a resulting in saving of development time and cost.

DRAWINGS

In order that the present invention be more readily understood, an embodiment thereof will now be described, by way of example, with reference to the accompanying drawings in which:

FIG. 1 is a diagram of circuitry according to the present invention; and

FIGS. 2*1-d* show wave form s with a common horizontal time axis, which are helpful in explaining the operation of the circuitry shown in FIG. 1.

DETAILED DESCRIPTION

Figure 1:
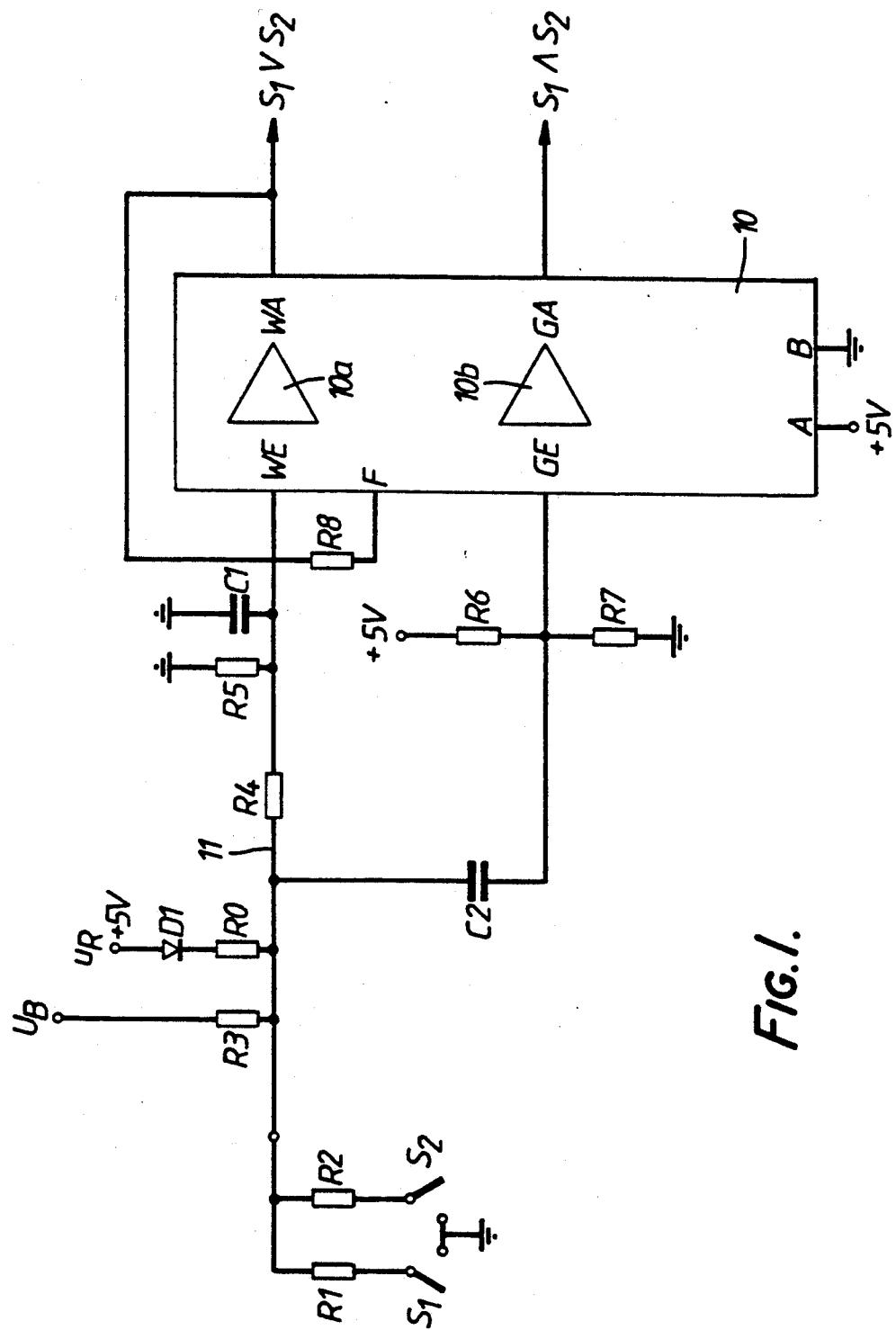

The embodiment shown in FIG. 1 of the drawings relates to a control circuit based on a hybrid circuit device 10 including two Schmitt trigger devices 10a, 10b, the first of which has an input WE and an output WA, and the second of which has an input GE and an output GA. The second Schmitt trigger 10b has a control input F. If the input of F is low then the input impedance of the input GE is high; otherwise a high voltage on F forces GE to a low input impedance. The output from WA is fed back to the input F of the other Schmitt trigger to ensure that the second Schmitt trigger only switches when the output of the first Schmitt trigger 10a is low.

An analog transmission line 11 is connected to the input WE of the first Schmitt trigger via a resistor combination R4, R5 and to the input GE of the second Schmitt trigger via a differentiating capacitor C2 and a resistor divider network R6, R7 whose values set the operating point of the second Schmitt trigger. Two switches S1 and S2 are connected in parallel via respective series resistors R1 and R2 to the transmission line 11. A series connected diode D1 and resistor R0 connect the transmission line to a source of reference potential UR e.g. at 5 volts, in order to establish a reference voltage level on the transmission line which is independent of battery voltage. However, the transmission line 11 is also connected to battery voltage UB via resistor R3 in order to achieve a large voltage excursion beyond the reference voltage level when both switches S1 and S2 are open. It has been found that optimum voltage excursions of the voltage on the transmission line occurs when R0, R1 and R2 are equal in value.

Figure 2:
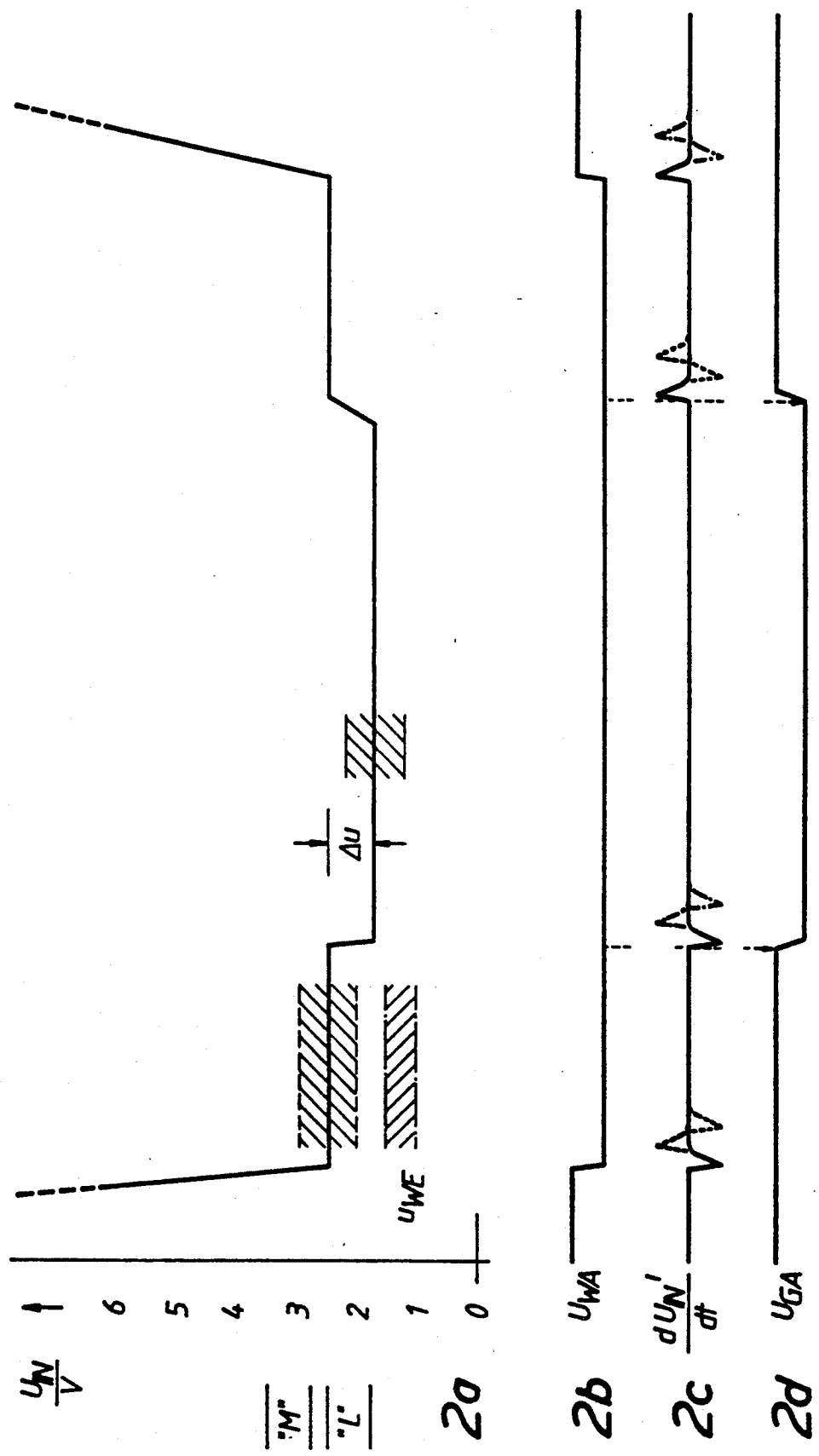

Referring now to FIG. 2, this shows four waveform diagrams 2a-2d, the uppermost of which 2a represents the voltage excursions UIN at the input WE of the first Schmitt trigger; the next waveform 2b represents the output voltage U from the output WA of the first Schmitt trigger; the next waveform 2c shows the waveform of the time differential of the waveform $U_{IN}$ i.e. the input to GE as the switches S1 and S2 are closed and opened sequentially; and the final waveform 2d shows the output U from the output GA of the second Schmitt trigger.

In the initial condition of the circuitry shown in FIG. 1, the two switches S1 and S2 are assumed to be both open in which case and, as shown in 2a, the voltage on the transmission line 11 approximates to battery voltage UB. As soon as one of the switches is closed, the voltage at the input WE of the first Schmitt trigger drops to a reference level determined by the value of the reference voltage and the values of the resistors R1 or R2 and R0. As indicated in 2b, the output voltage from the output WA of the first Schmitt trigger drops but the output voltage from the output GA of the second Schmitt trigger is unaffected as shown in 2d.

When both switches S1 and S2 are closed, the voltage waveform 2a drops still further by an amount delta U due to the parallel combination of resistors R1 and R2. This has no effect on the output voltage at the output WA of the first Schmitt trigger but now causes the voltage at the output GA of the second Schmitt trigger to drop as shown in 2d.

The voltage excursion delta U when both switches are closed is only relatively small, delta U approximately equals 0.8 volts. The capacitor C2 converts the small voltage excursion into a switching current as indicated in diagram 2c in order to avoid problems due to narrowing of the useful switching excursion caused by earth potential offset and switching tolerances had a direct voltage coupling been used as in the input to the first Schmitt trigger.

As soon as one of the switches S1 or S2 is opened, the output from the second Schmitt trigger GA goes high as shown on the right-hand side of 2d due to the removal of the offset voltage delta U from the transmission line 11. When the second switch is opened, the circuit returns to its initial conditions as indicated on the right hand side of all the diagrams.

As will be seen from FIG. 1, the output WA from the first Schmitt trigger indicates when either S1 or S2 is closed and the output GA from the second Schmitt trigger indicates when both the switches S1 and S2 are closed. Thus, a binary evaluation of the two switch inputs is obtained and can be evaluated by a microprocessor without the need of a A/D converter. There are many instances where there is an unambiguous switching sequence which can be interpreted by the microprocessor i.e. first S1 is closed, then S2 is closed then S2 is opened, and finally S1 is opened.

I claim:

1. Apparatus having two external sensors in the form of a first switch device (S1) and a second switch device (S2), each responding to external influences by shifting between a closed switch condition and an pen switch condition,
   including means for obtaining two binary output signals which together indicate the switch conditions of both of said switch devices using only a single analog transmission line (11) to which said first and second switch devices (S1, S2) are connected, in parallel, via respective resistances (R1, R2),
   said means including first and second trigger switching devices (10a, 10b) having respective inputs (WE, GE) which are connected to the transmission line, and respective outputs (WA, GA) which provide said binary output signals,
   means for applying a reference voltage (UR) to the inputs of said trigger switching devices (10a, 10b), means for setting the threshold of the two trigger switching devices (10a, 10b), and
   a differentiating network (C2, R6, R7),
   wherein
   the input (WE) of said first rigger switching device is connected directly to said single analog transmission line (11);
   the input (GE) of said second trigger switching device is connected via said differentiating network to said single analog transmission line (11);
   said second trigger switching device also has a control or feedback input (F) which is connected to the output (WA) of the first trigger switching device (10a) to ensure that the second trigger switching device (10b) only switches when the binary output signal of the first rigger switching device is low;
   whereby the binary output signal of the first triger switching device indicates when either of said sensors (S1, S2) is in a closed switch condition, and the binary output signal of said second trigger switching device indicates when both of said sensors (S1, S2) are in a closed switch condition, said two binary output signals thereby together defining the respective switch conditions of both sensors without any additional analog-to-digital conversion circuitry.

2. Apparatus according to claim 1,
   further comprising
   an additional power supply (U$_B$) having an output which is applied to said transmission line (11) to pull up a voltage on the transmission line (11) to a higher level when said switch devices (S1, S2) are in said open switch condition.

3. Apparatus according to claim 1,
   wherein
   the trigger switching devices (10a, 10b) are Schmitt triggers.

4. Apparatus according to claim 2,
   wherein
   the trigger switching devices (10a, 10b) are Schmitt triggers.

5. Apparatus according to claim 1,
   wherein
   said differentiating network includes a differentiating capacitor which couples a voltage on the transmission line (11) to the input (GE) of the second trigger switching device (10b).

6. Apparatus according to claim 2,
   wherein
   said differentiating network includes a differentiating capacitor which couples a voltage on the transmission line (11) to the input (GE) of the second trigger switching device (10b).

7. Apparatus according to claim 3,
   wherein
   said differentiating network includes a differentiating capacitor which couples a voltage on the transmission line (11) to the input (GE) of the second trigger switching device (10b).

8. Apparatus according to claim 4,
   wherein
   said differentiating network includes a differentiating capacitor which couples a voltage on the transmission line (11) to the input (GE) of the second trigger switching device (10b).

9. Apparatus according to claim 1,
   characterized in that
   the means for applying the reference voltage (UR) to the transmission line (11) comprises a voltage source (UR) and a series-connected resistance (R0) and diode (D1) connected between said source and said transmission line.

10. Apparatus according to claim 2,
    characterized in that
    the means for applying the reference voltage (UR) to the transmission line (11) comprises a voltage source (UR) and a series-connected resistance (R0) and diode (D1) connected between said source and said transmission line.

11. Apparatus according to claim 3,
    characterized in that
    the means for applying the reference voltage (UR) to the transmission line (11) comprises a voltage source (UR) and a series-connected resistance (R0) and diode (D1) connected between said source and said transmission line.

12. Apparatus according to claim 4,
    characterized in that
    the means for applying the reference voltage (UR) to the transmission line (11) comprises a voltage source (UR) and a series-connected resistance (R0) and diode (D1) connected between said source and said transmission line.

13. Apparatus according to claim 5,
    characterized in that
    the means for applying the reference voltage (UR) to the transmission line (11) comprises a voltage source (UR) and a series-connected resistance (R0) and diode (D1) connected between said source and said transmission line.

14. Apparatus according to claim 6,
    characterized in that
    the means for applying the reference voltage (UR) to the transmission line (11) comprises a voltage source (UR) and a series-connected resistance (R0) and diode (D1) connected between said source and said transmission line.

15. Apparatus according to claim 7,
    characterized in that
    the means for applying the reference voltage (UR) to the transmission line (11) comprises a voltage source (UR) and a series-connected resistance (R0) and diode (D1) connected between said source and said transmission line.

16. Apparatus according to claim 8, characterized in that
the means for applying the reference voltage (UR) to the transmission line (11) comprises a voltage source (UR) and a series-connected resistance (R0) and diode (D1) connected between said source and said transmission line.

17. Apparatus according to claim 9, wherein
the resistance values of the series-connected resistance and the respective resistances (R1, R2) which connect the two switch devices (S1, S2) to the transmission line are all the same.

* * * * *